(12) United States Patent
Yang et al.

(10) Patent No.: US 12,409,759 B2
(45) Date of Patent: Sep. 9, 2025

(54) SYSTEMS AND METHODS TO MONITOR SEATS FOR DIAGNOSTICS, PROGNOSTICS AND DEGRADATION

(71) Applicant: Magna Seating Inc, Aurora (CA)

(72) Inventors: Hanlong Yang, Novi, MI (US); NandaKishor R. Chamakuri, Pune (IN); Shriram B. Agalave, Pune (IN)

(73) Assignee: Magna Seating Inc., Aurora (CA)

( * ) Notice: Subject to any disclaimer, the term of this patent is extended or adjusted under 35 U.S.C. 154(b) by 101 days.

(21) Appl. No.: 18/284,965

(22) PCT Filed: Mar. 30, 2022

(86) PCT No.: PCT/US2022/022422
§ 371 (c)(1),
(2) Date: Sep. 29, 2023

(87) PCT Pub. No.: WO2022/212427
PCT Pub. Date: Oct. 6, 2022

(65) Prior Publication Data
US 2024/0181937 A1 Jun. 6, 2024

Related U.S. Application Data

(60) Provisional application No. 63/167,938, filed on Mar. 30, 2021.

(51) Int. Cl.
B60N 2/02 (2006.01)
G01M 13/021 (2019.01)
G01R 23/18 (2006.01)

(52) U.S. Cl.
CPC ....... *B60N 2/0244* (2013.01); *B60N 2/02253* (2023.08); *G01M 13/021* (2013.01); *G01R 23/18* (2013.01)

(58) Field of Classification Search
CPC ............ B60N 2/0244; B60N 2/02253; G01M 13/021; G01R 23/18
See application file for complete search history.

(56) References Cited

U.S. PATENT DOCUMENTS

| 6,507,789 | B1 | 1/2003 | Reddy et al. |
| 7,019,660 | B2 | 3/2006 | Seto et al. |
| 10,833,622 | B2 | 11/2020 | Li et al. |

(Continued)

FOREIGN PATENT DOCUMENTS

| CN | 106950058 | 7/2017 |
| EP | 1489401 | 12/2004 |

(Continued)

*Primary Examiner* — Mathew Franklin Gordon
(74) *Attorney, Agent, or Firm* — Miller Canfield

(57) ABSTRACT

A method is provided for detecting a fault in a gear system for repositioning a seat assembly in an automotive vehicle. The gear system includes a gear train operatively coupled to a motor. The method includes the steps of measuring a current drawn by the motor to reposition the seat assembly, recording the current over time as a current waveform, converting the current waveform into a frequency domain, determining a base frequency of the current waveform based on the converted current waveform, calculating a power spectrum density at the base frequency, calculating a total band power of the power spectrum density, and determining whether the total band power is greater than a predetermined total band power threshold.

22 Claims, 14 Drawing Sheets

(56) References Cited

U.S. PATENT DOCUMENTS

| | | |
|---|---|---|
| 10,910,977 B2 | 2/2021 | Barlini |
| 2003/0080699 A1 | 5/2003 | Rumney |

FOREIGN PATENT DOCUMENTS

| | | |
|---|---|---|
| EP | 2743670 | 6/2014 |
| KR | 20200081591 | 7/2020 |
| WO | 2003002256 | 1/2003 |

SYSTEMS AND METHODS TO MONITOR SEATS FOR DIAGNOSTICS, PROGNOSTICS AND DEGRADATION

CROSS-REFERENCE TO RELATED APPLICATIONS

This application claims priority to U.S. Provisional Application 63/167,938, filed on Mar. 30, 2021, the disclosure of which is hereby incorporated by reference in its entirety.

BACKGROUND OF THE INVENTION

1. Field of the Invention

The present invention relates to a seat assembly having a gear train. More particularly, the invention relates to methods of detecting faults within the gear train of the seat assembly.

2. Description of Related Art

Seat assemblies in automotive vehicles typically include systems to control the movement and positioning of the seat assemblies. Over time, performance of the systems degrades due to repetitive operation or aging effects, which may impede the smooth transition between the seat configurations, alter the positioning of the seat assembly, and/or diminish proper functioning of the seat assembly. In addition, expected and unexpected impacts can change various system components. There is a need for a system that can detect variations that occur over time so that the system may be repaired before the degradation becomes noticeable to the user and/or the system becomes non-operational.

SUMMARY OF THE INVENTION

According to one embodiment, there is provided a method for detecting a fault in a gear system for repositioning a seat assembly in an automotive vehicle. The gear system includes a gear train operatively coupled to a motor. The method comprises the steps of measuring a current drawn by the motor to reposition the seat assembly, recording the current over time as a current waveform, converting the current waveform into a frequency domain, determining a base frequency of the current waveform based on the converted current waveform, calculating a power spectrum density at the base frequency, calculating a total band power of the power spectrum density, and determining whether the total band power is greater than a predetermined total band power threshold.

According to another embodiment, there is provided a method for detecting a fault in a gear system for repositioning a seat assembly in an automotive vehicle. The gear system includes a gear train operatively coupled to a motor. The method comprises the steps of measuring a current drawn by the motor to reposition the seat assembly, recording the current over time as a current waveform, using a continuous wavelet transformation process to calculate a signature of the current waveform, and determining whether the signature is greater than a predetermined signature threshold.

According to another embodiment, there is provided a method for detecting a fault in a gear system for repositioning a seat assembly in an automotive vehicle. The gear system includes a gear train operatively coupled to a motor. The method comprises the steps of applying a voltage pulse to the motor, measuring a current drawn by the motor while the voltage pulse is applied to the motor, recording the current over time as a current waveform, determining a rise time in the current waveform for the current to reach a predetermined current amplitude, and determining whether the rise time is greater than a predetermined rise time threshold.

According to another embodiment, there is provided a method for detecting a fault in a gear system for repositioning a seat assembly in an automotive vehicle. The gear system includes a gear train operatively coupled to a motor having a drive shaft. The method comprises the steps of measuring a hall effect signal from the drive shaft indicating a rotational position and a rotational speed of the drive shaft over time, comparing the hall effect signal to an expected hall effect signal for the motor, and determining whether the hall effect signal is different from the expected hall effect signal.

BRIEF DESCRIPTION OF THE DRAWINGS

Advantages of the present invention will be readily appreciated as the same becomes better understood by reference to the following detailed description when considered in connection with the accompanying drawings wherein.

DETAILED DESCRIPTION OF THE EMBODIMENTS

The present invention relates to systems and methods for detecting faults in the operation of seat assemblies 10 in automotive vehicles. Directional references employed or shown in the description, figures, or claims, such as top, bottom, upper, lower, upward, downward, lengthwise, widthwise, left, right, and the like, are relative terms employed for ease of description and are not intended to limit the scope of the invention in any respect. Referring to the Figures, like numerals indicate like or corresponding parts throughout the several views.

Figure 1:
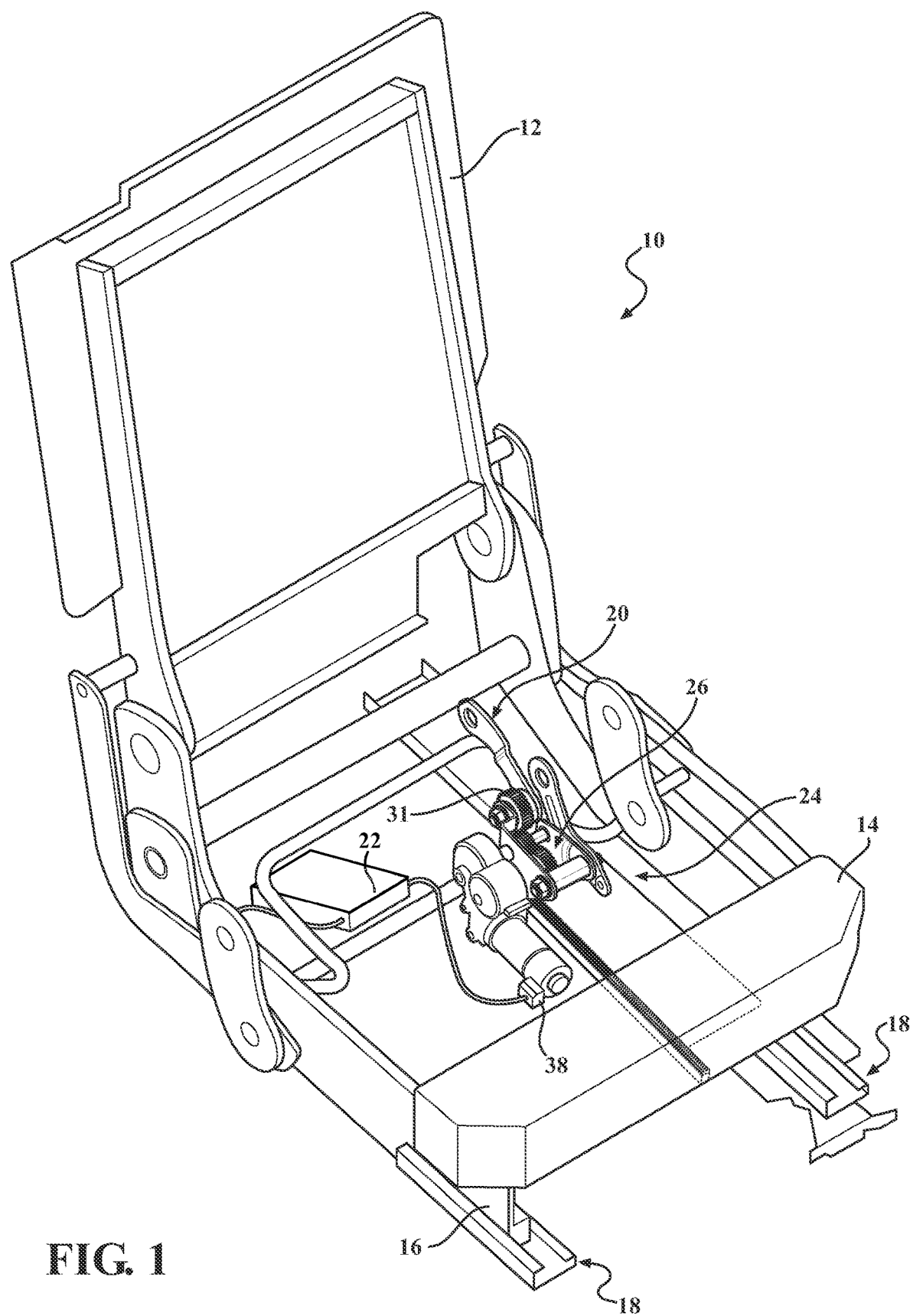
FIG. 1 is a perspective view of a seat assembly having a gear system, according to one embodiment of the present invention.

As depicted in FIG. 1, the seat assembly 10 includes a seat back 12, a seat cushion 14, a seat base 16, a pair of adjuster assemblies 18, and a linkage assembly 20. The seat back 12 is rotatably coupled to the seat cushion 14. The linkage assembly 20 pivotably couples the seat cushion 14 to the seat base 16. The seat base 16 is transposable fore and aft along the pair of adjuster assemblies 18.

The seat assembly 10 also includes an electronic control unit (ECU) 22 and one or more gear systems 24. Each gear system 24 includes a gear train 26 operatively coupled with one or more motors 29. The ECU 22 controls the movement and positioning of the seat assembly 10 by controlling the motors 29 which drive the gear trains 26. The ECU 22 not only controls the movement and positioning of the seat assembly 10, but it also monitors these activities to ensure that they are working properly over time.

Figure 2:
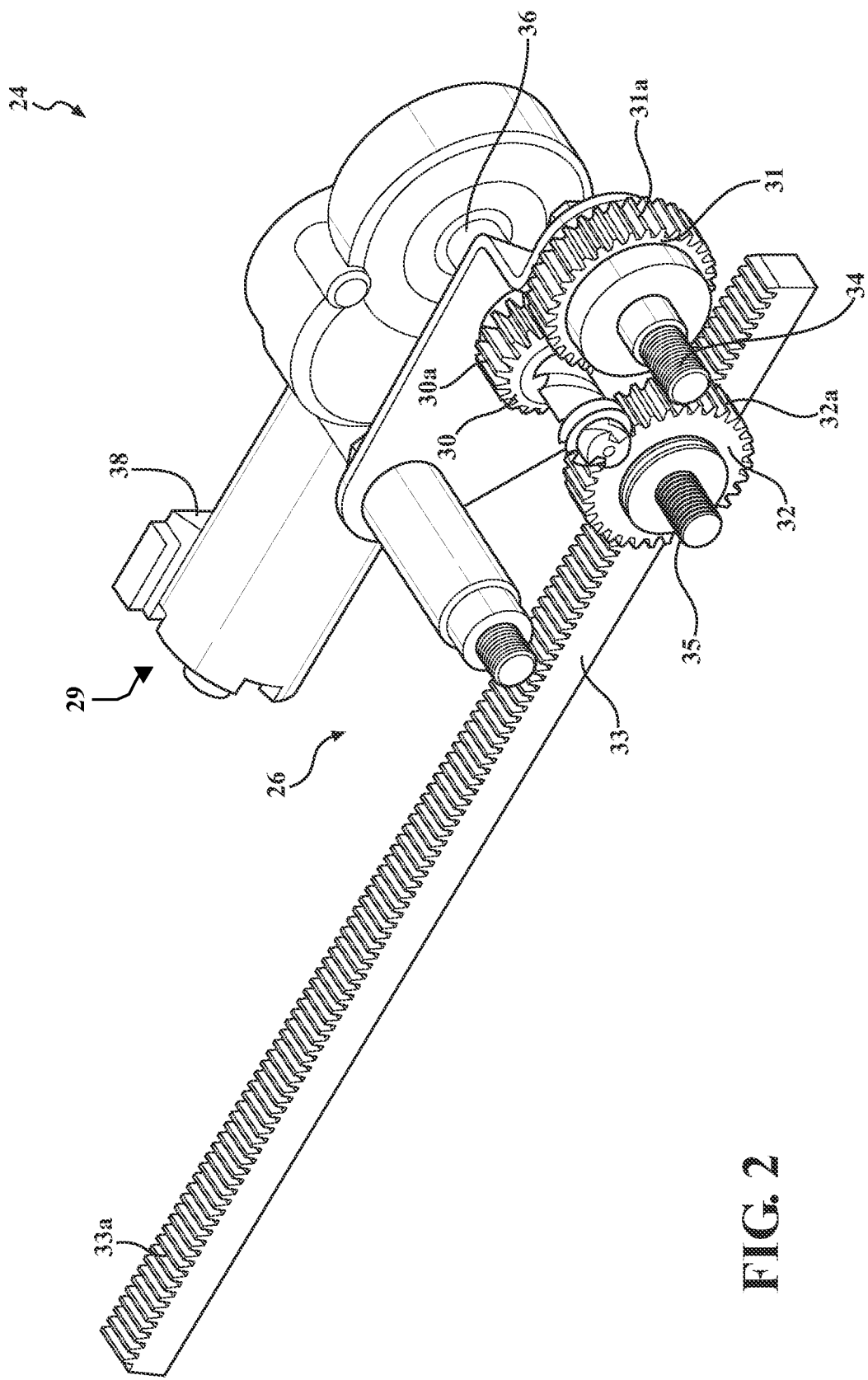
FIG. 2 is a perspective view of the gear system of FIG. 1.

The exemplary gear train 26 shown in FIG. 2 includes a drive gear 30, a plurality of driven gears 31, 32 and a rack 33. Each of the gears 30, 31, 32 and the rack 33 includes teeth 30a, 31a, 32a, 33a that meshingly engage with each other. The driven gears 31, 32 are each coupled to a respective shaft 34, 35 that is operatively coupled to other components of the seat assembly 10, e.g., the linkage assembly 20. The motor 29 includes a drive shaft 36 fixedly coupled to the drive gear 30. The gear shafts 34, 35 and the drive shaft 36 are rotationally supported by one or more bearings, thrust washers, and the like.

The gear train 26 is configured to generally lock in place when in non-operating conditions. Maintaining proper locking of the gears 30-33 avoids unexpected movement of the seat assembly 10.

The seat assembly 10 includes a hall effect sensor 38 that is operatively connected to the drive shaft 36. The hall effect sensor 38 outputs a hall effect signal 42 comprising a series of hall effect pulses 44 (see FIG. 8) indicative of the rotational position and the rotational speed of the drive shaft 36. Because the rotational position of the drive shaft 36 is related to movement of the gear train 26 and the resulting movement of the seat assembly 10, the ECU 22 can be configured to predict the resulting movement of the seat assembly 10 based in part on the hall effect signal 42.

Over time, the components of the gear system 24 can degrade or become faulty. For example, the gear teeth 30a, 31a, 32a, 33a, bearings or shafts 34, 35, 36 may become worn or damaged or become misaligned. These defects can alter or impede the performance of the gear train 26. For example, the gear system 24 may become inoperable or the gear train 26 may not lock properly. The defects also may increase the amount of noise or vibration in the seat assembly 10 or cause unexpected movements.

A gear system 24 that is operating as expected and is free of defects is generically described as a healthy gear system 24. In contrast, a gear system 24 having defects is generically described as an unhealthy gear system 24.

Figure 3:
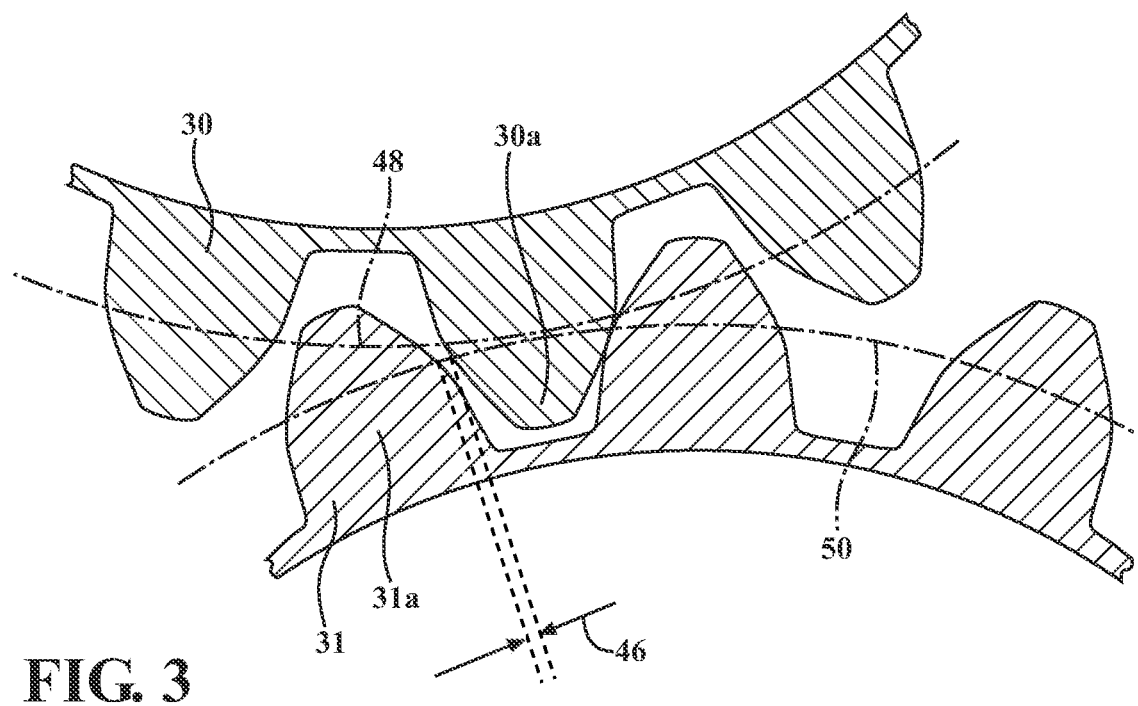
FIG. 3 is an enlarged schematic representation of meshed gear teeth within the gear train of FIG. 2.
Figure 4:
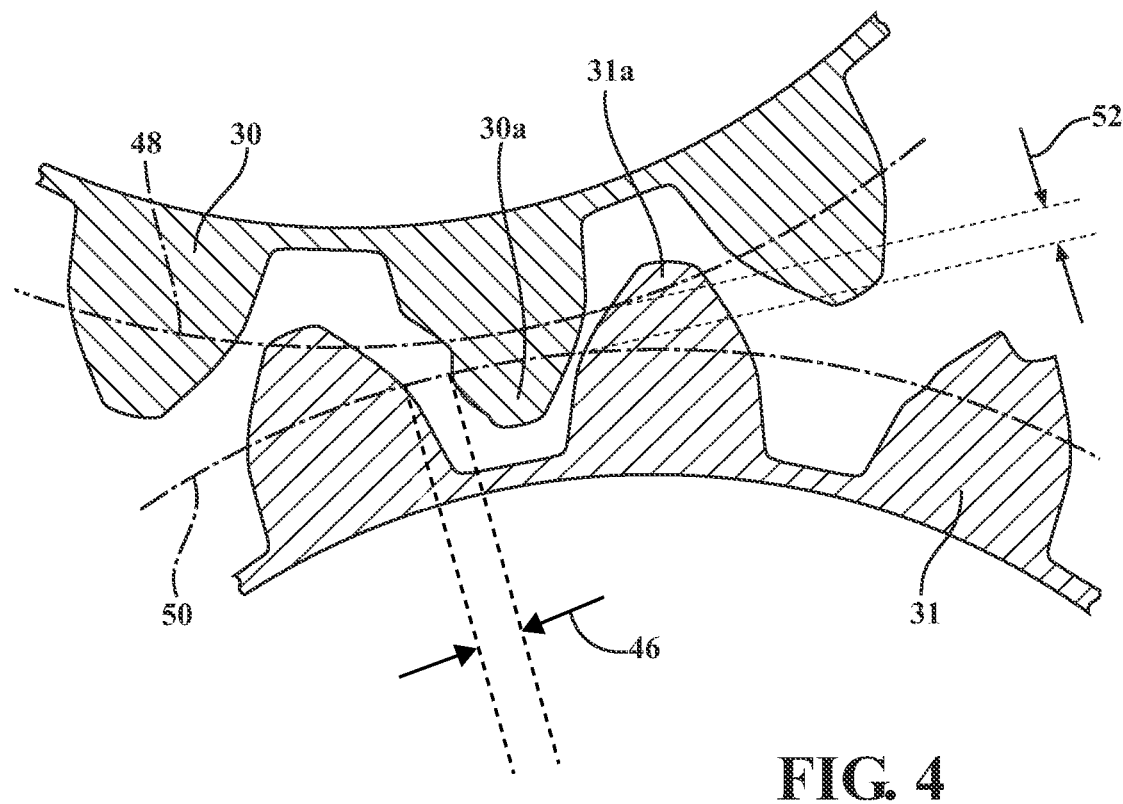
FIG. 4 is an enlarged schematic representation of the meshed gear teeth in FIG. 3, after the gear teeth become damaged.

FIG. 3 shows the engagement of the gear teeth 30a, 31a when the gears 30, 31 are free of defects, while FIG. 4 shows the engagement of the gear teeth 30a, 31a when the gears 30, 31 are worn or damaged. As shown in FIG. 3, the gear teeth 30a, 31a are typically configured such that there is a predefined amount of backlash 46 between the teeth 30a, 31a. As shown in FIG. 4, wear or damage to the gear teeth 30a, 31a may alter the spacing and increase the backlash 46 between the teeth 30a, 31a, which translates into loss motion between the gears 30, 31. Damaged gears 30, 31 may slip under load or shift relative to each other so that the gears 30, 31 may rotate relative to each other when in non-operating conditions. Movement of the gear train 26 during non-operating conditions is undesirable and is described as improper locking.

Each gear 30, 31 has an operating pitch circle 48, 50. In a healthy gear train 26, the operating pitch circles 48, 50 are typically tangent to each other, as shown in FIG. 3. Bearing wear and shaft 34, 35, 36 wear may cause the gears 30, 31 to separate or shift relative to each other, forming a gap 52 between the operating pitch circles 48, 50 of the gears 30, 31, as shown in FIG. 4. In addition, damaged bearings can cause a "wobbly axis" where the drive shaft 36 or the gear shafts 34, 35 wobble within the opening of the bearing around the longitudinal axis of the bearing.

The mechanical connections between the gears 30, 31, 32 and the respective mounting shafts 36, 34, 35 may loosen over time to cause a "loose axis" where a gear 30-32 will rotate relative to a mounting shaft 36, 34, 35. A gear 30-32 that is loose on a mounting shaft 36, 34, 35 can result in improper locking in the gear train 26 and can result in damage to the gear teeth 30a-33a. Further, the improper locking can cause unexpected movement of the seat assembly 10 during adverse conditions.

The ECU 22 is configured to monitor the current drawn by the motor 29 during operation of the gear train 26. The ECU 22 also records the current over time, as reflected in the exemplary current waveform 54 shown in FIG. 5. When the motor 29 initially receives power, the motor 29 begins to rotate the drive shaft 36 causing the drive gear 30 to rotate. The current drawn by the motor 29 rapidly increases as the motor 29 initiates rotation of the drive shaft 36 and all of the gears 30-32 and equipment tied to the gear train 26, as reflected in portion A of the current waveform 54 in FIG. 5. After the gear train 26 starts moving, less power is needed to drive the gear train 26. Therefore, the current will begin to decrease after it reaches a peak, 56, as reflected in portion B of the current waveform 54. Portion C shows the current waveform 54 during steady state conditions. As shown, the steady state current forms ripples that reflect torsional vibrations in the gear system 24. The gears 30-32 and motor 29 cause torsional vibrations in the gear system 24 that are related to a number of factors including the speed with which each gear 30-32 is rotating, the number of gear teeth 30a-32a in each gear 30-32, and the speed of rotation of the mounting shafts 36, 34, 35. The torsional vibrations include vibrational components having base frequencies F29-F32, which reflect the operating frequencies of the motor 29 and the gears 30-32 during steady state conditions. The base frequency F29 of the motor 29 is typically larger than the base frequencies F30-F32 of the individual gears 30-32 of the gear train 26. Thus, the ripples in the current waveform 54 include frequency components F29-F32 of the motor 29 and gears 30-32 of the gear train 26. Portion D of FIG. 5 shows the current waveform 54 when the gear train 26 encounters an expected or unexpected impact.

Figure 6:
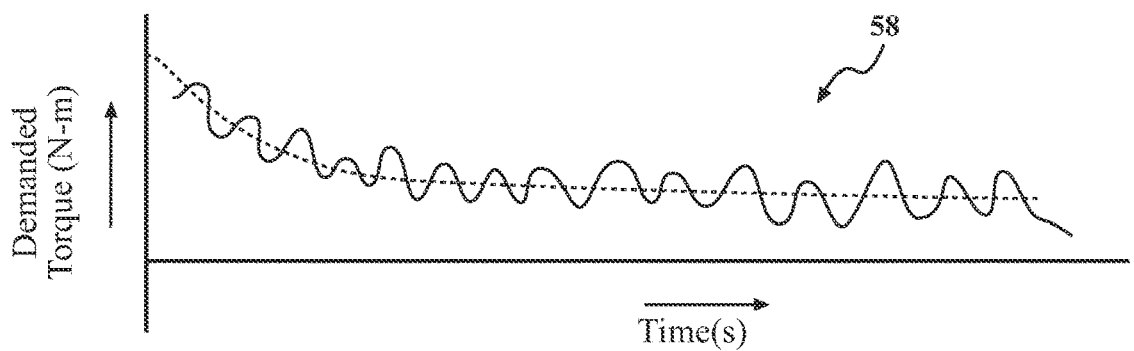
FIG. 6 is a graphical representation of demanded torque by the motor during operation of the gear train of FIG. 2.

FIG. 6 shows a graphical representation of an exemplary demanded torque 58 applied by the motor 29 during steady state conditions. The torque 58 forms torque ripples, which reflect the torsional vibrations in the gear system 24. Similar to the ripples in the current waveform 54, these torque ripples include frequency components F29-F32 of the motor 29 and the gears 30-32 of the gear train 26.

Defects in the gear system 24 are reflected in the current waveform 54 drawn by the motor 29 and the demanded torque 58 applied by the motor 29 during steady state conditions. For example, FIG. 5 illustrates some differences in the current waveform 54 when the gear system 24 is healthy versus the current waveform 54' when the gear system 24 is unhealthy. As shown, the maximum amplitude peak 56 of the current waveform 54 of the healthy gear system 24 is larger than the maximum amplitude peak 56' of the current waveform 54' of the unhealthy gear system 24. In addition, the rise time dt1 to reach a maximum amplitude peak 56 for the healthy gear system 24 is shorter than the rise time dt2 to reach a maximum amplitude peak 56' for the unhealthy gear system 24.

Figure 5:
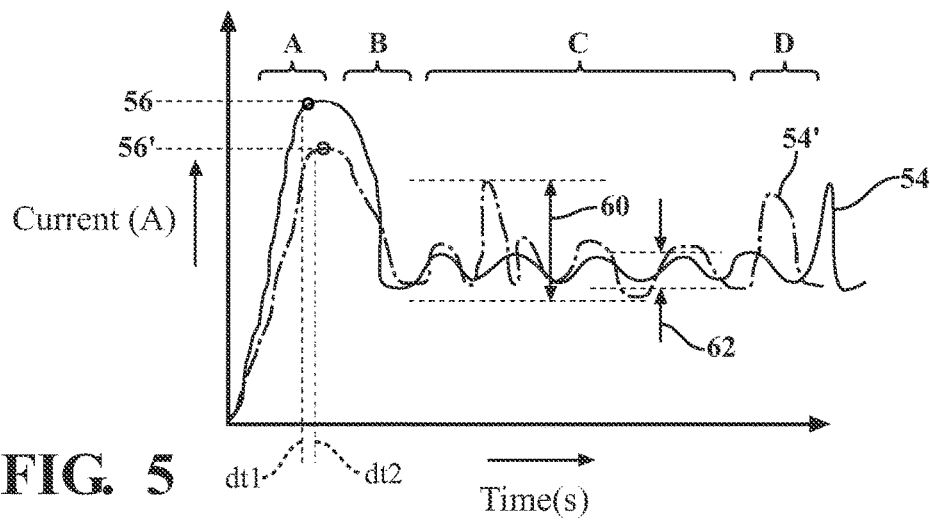
FIG. 5 is a graphical representation of current drawn by a motor during operation of the gear train of FIG. 2.

Further, during steady state conditions, as reflected in portion C of FIG. 5, the current waveform 54' driving the unhealthy gear system 24 is not as consistent as the current waveform 54 driving the healthy gear system 24, and has a greater amplitude variation 60 than the amplitude variation 62 of the healthy current waveform 54. It is to be appreciated that the actual current waveforms 54, 54' drawn by the motor 29 during operation of the gear system 24 will vary based in part on the specific gear train 26, the specific motor 29, and factors such as specific defects present in the unhealthy gear system 24.

Figure 7:
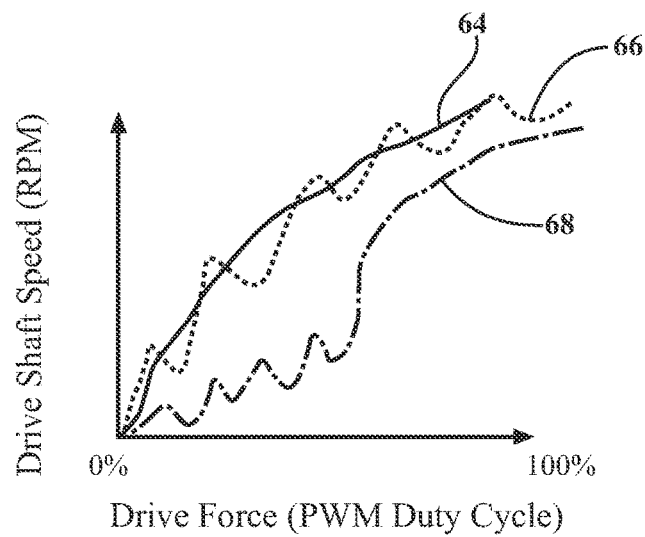
FIG. 7 is a graphical representation of drive shaft speed in comparison to applied drive force for the motor of FIG. 2.

Certain motors 29 are powered using a pulse width modulated (PWM) signal that can vary from 0% duty cycle (i.e., no signal is provided) to 100% duty cycle (i.e., full power is provided). The drive force provided to the motor 29 is related to the duty cycle of the PWM signal. FIG. 7 shows an exemplary transfer function 64 between the rotational speed of the drive shaft 36 in relation to the drive force provided to the motor 29 with a healthy gear system 24. As depicted, the rotational speed of the drive shaft 36 increases as the PWM duty cycle increases, while the slope of the curve decreases with increasing PWM duty cycles. When the gear train 26 has one or more wobbly axes of shafts 36, 34, 35, the resulting transfer function 66 is similar to the normal transfer function 64, but includes oscillations. In contrast, when the gear train has one or more loose axes of shafts 36, 34, 35, the transfer function 68 reflects a lower rotational speed of the drive shaft 36 with increasing drive force, and initially includes oscillations.

Figure 8:
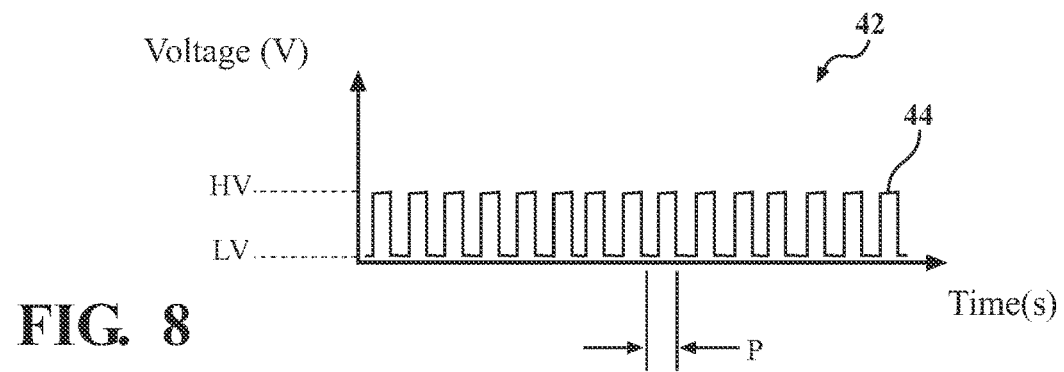
FIG. 8 is a graphical representation of hall effect sensor feedback in response to provided power to the motor when the gear train of FIG. 2 is healthy.
Figure 10:
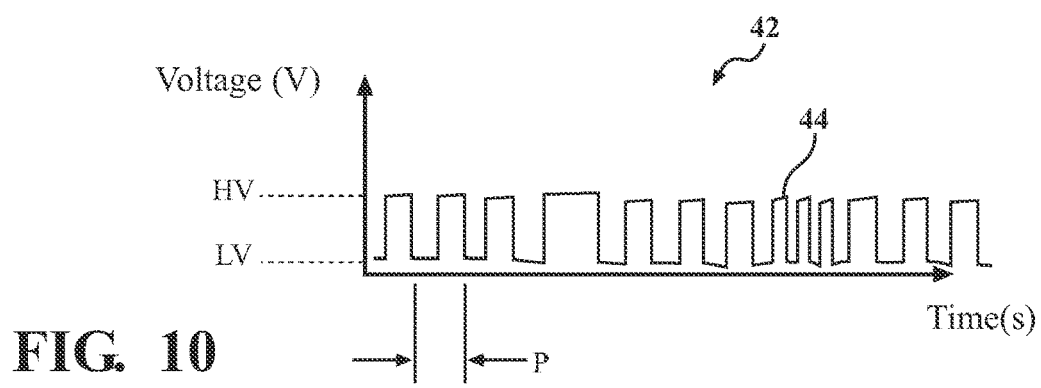
FIG. 10 is a graphical representation of hall effect sensor feedback in response to provided power to the motor when the gear train of FIG. 2 is unhealthy.

Referring to FIG. 8, when the gear system 24 is healthy, exemplary hall effect pulses 44 have a consistent pulse period P (i.e., the amount of time between successive transitions from low voltage LV to high voltage HV). In contrast, the pulse period P in an unhealthy gear system 24 may fluctuate over time, as illustrated in FIG. 10. Thus, variation in the pulse periods P under constant PWM power may be indicative of faults in gear system 24, such as one or more loose or wobbly axes of shafts 36, 34, 35, or unacceptable backlash 46.

Figure 9:
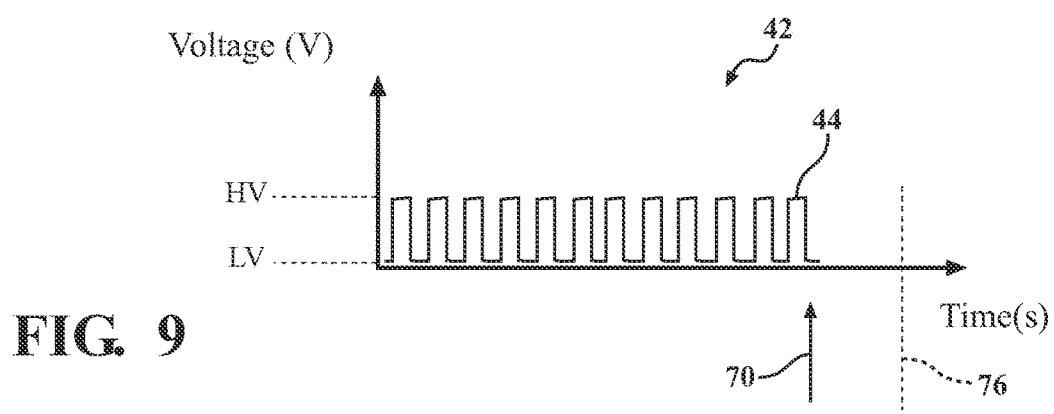
FIG. 9 is a graphical representation of hall effect sensor feedback in response to the motor stalling when the gear train of FIG. 2 is healthy.

FIG. 9 illustrates exemplary hall effect pulses 44 when the drive shaft 36 stops rotating, such as when PWM power is terminated to the motor 29 or the seat assembly 10 impacts an expected or unexpected obstruction. When the power is terminated or the seat assembly 10 impacts an obstruction at time 70, the hall effect pulses 44 will terminate shortly thereafter.

Figure 11:
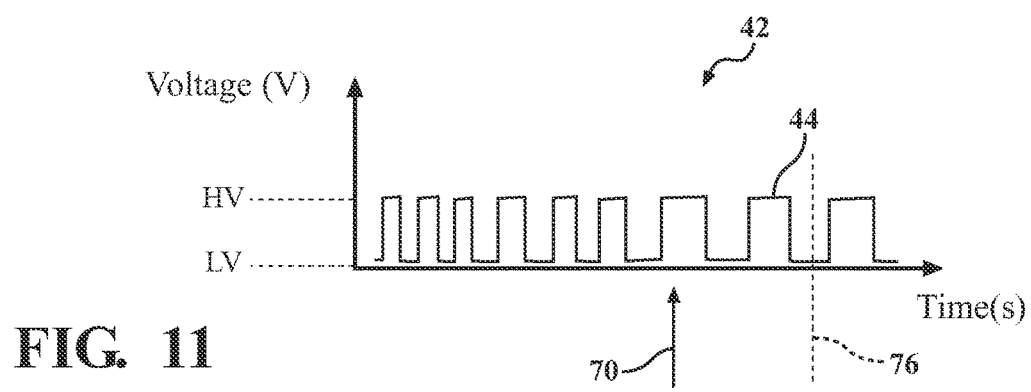
FIG. 11 is a graphical representation of hall effect sensor feedback in response to the motor stalling when the gear train of FIG. 2 is unhealthy.

In contrast and as illustrated in FIG. 11, with an unhealthy gear system 24, the backlash 46 in the gear train 26 and/or defects such as one or more wobbly axes or loose axes of shafts 36, 34, 35 may cause additional oscillatory rotational movement of the drive shaft 36 in both forward and rearward rotational directions after the power is terminated or the seat assembly 10 impacts an obstruction, resulting in more hall effect pulses 44 appearing after time 70 compared to the number of hall effect pulses 44 appearing after time 70 with a healthy gear system 24. A stop threshold 76 can be experimentally determined to identify unhealthy gear systems 24 when the amount of hall effect pulses 44 detected after impact 70 is greater than the stop threshold 76.

Figure 12:
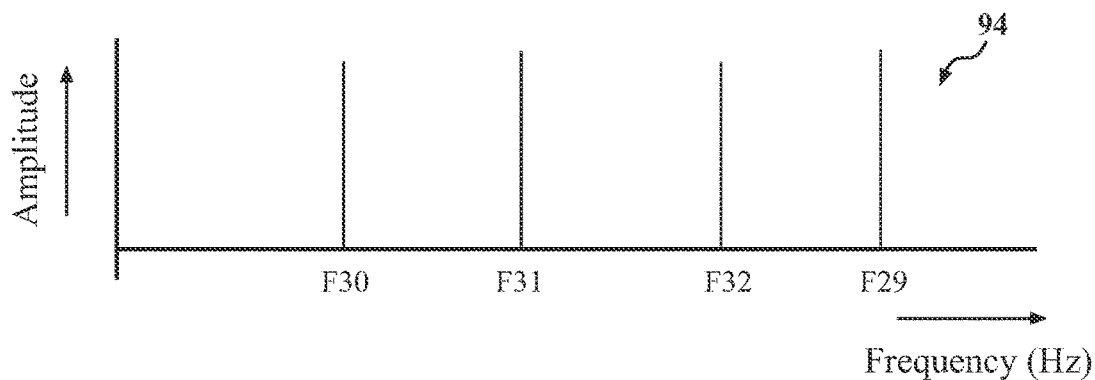
FIG. 12 is a graphical representation of the current measurements of FIG. 5 converted to the frequency domain.
Figure 13:
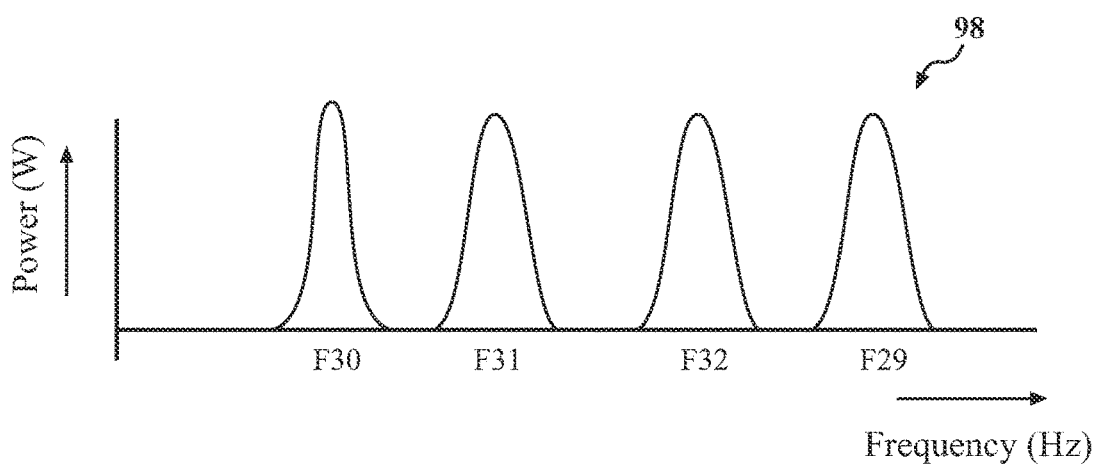
FIG. 13 is a graphical representation of calculated power spectrum densities at the base frequencies of FIG. 12 for a healthy gear train.
Figure 14:
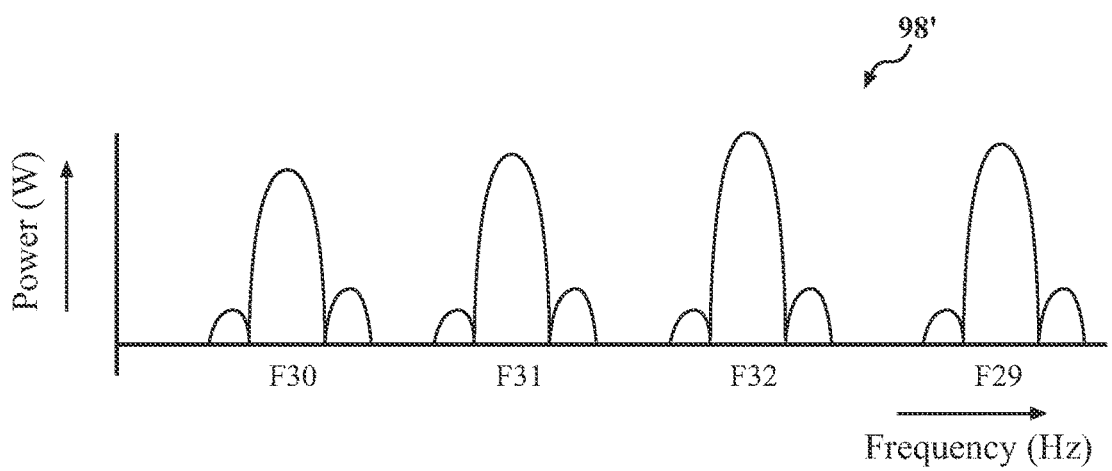
FIG. 14 is a graphical representation of calculated power spectrum densities at the base frequencies of FIG. 12 for an unhealthy gear train.
Figure 15:
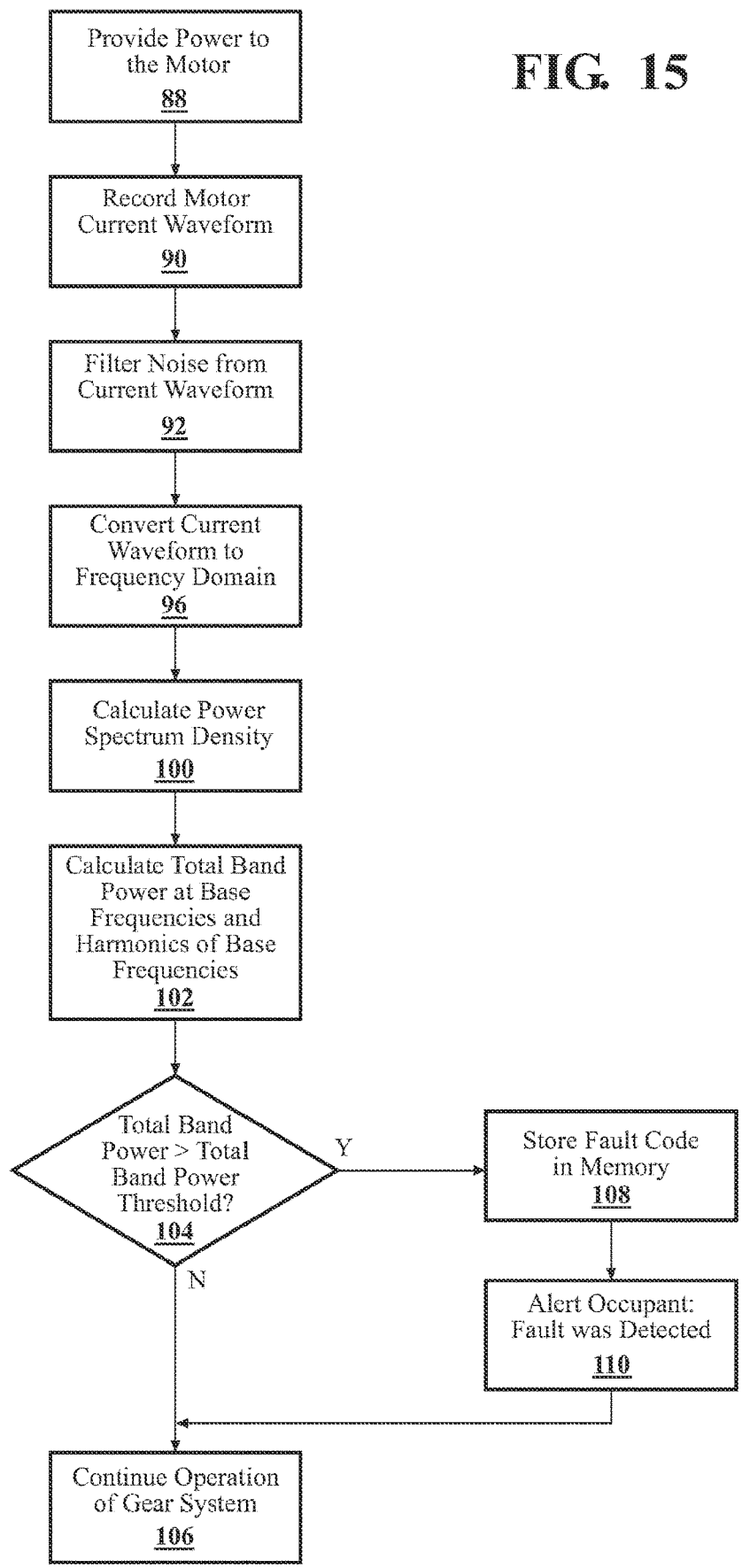
FIG. 15 is a flow chart of a first method for detecting an unhealthy gear train, according to one embodiment of the present invention.

Defects in the gear system 24 can be detected by analyzing the current waveform 54 using motor current signature analysis (MCSA) to isolate and evaluate changes in the frequency components F29-F32. A method for determining whether there are any faults in the gear system 24 according to a first embodiment of the present invention is shown in FIGS. 5, 6, and 12 through 15. Referring to FIG. 15, the ECU 22 initially provides power to the motor 29 (step 88) and records the motor current waveform 54, 54' (step 90). The ECU 22 then filters noise from the steady state portion C of the current waveform 54, 54' (step 92), and converts the filtered current waveform 54, 54' into the frequency domain 94 (step 96). FIG. 12 shows a graphical representation of the current waveform 54, 54' converted in the frequency domain 94. The base frequencies F29-F32 shown in FIG. 12 correspond to the base frequencies F29-F32 in the torsional vibrations caused by the motor 29 and the gears 30-32, respectively. Because the frequency components F29-F32 are also included in the torque ripples, the ECU 22 alternatively may convert the demanded torque 58 into the frequency domain 94 rather than converting the current waveform 54, 54' into the frequency domain 94 at step 96.

The ECU 22 then calculates the power spectrum density 98 at the base frequencies F29-F32 and at the harmonics of the base frequencies F29-F32 (FIG. 15, step 100). Referring to FIG. 13, the power spectrum density 98 is concentrated near the base frequencies F29-F32 when the gear system 24 is healthy. In contrast, when the gear system 24 is unhealthy, the power spectrum density 98' will accumulate around the base frequencies F29-F32 and around harmonics of the base frequencies F29-F32, as shown in FIG. 14.

Referring back to FIG. 15, the ECU 22 then calculates the total band power at the base frequencies F29-F32 and the harmonics of the base frequencies F29-F32 (step 102), and compares the calculated total band power to a predetermined total band power threshold (step 104). If the calculated total band power is less than or equal to the total band power threshold, then the gear system 24 is considered healthy and the ECU 22 continues operating the gear system 24 (step 106). If the calculated total band power is greater than the total band power threshold, then the gear system 24 is considered unhealthy and the ECU 22 stores a corresponding fault code in memory (step 108), and notifies the occupant that a fault has been detected (step 110). The ECU 22 then continues operation of the gear system 24 (step 106).

Figure 16:
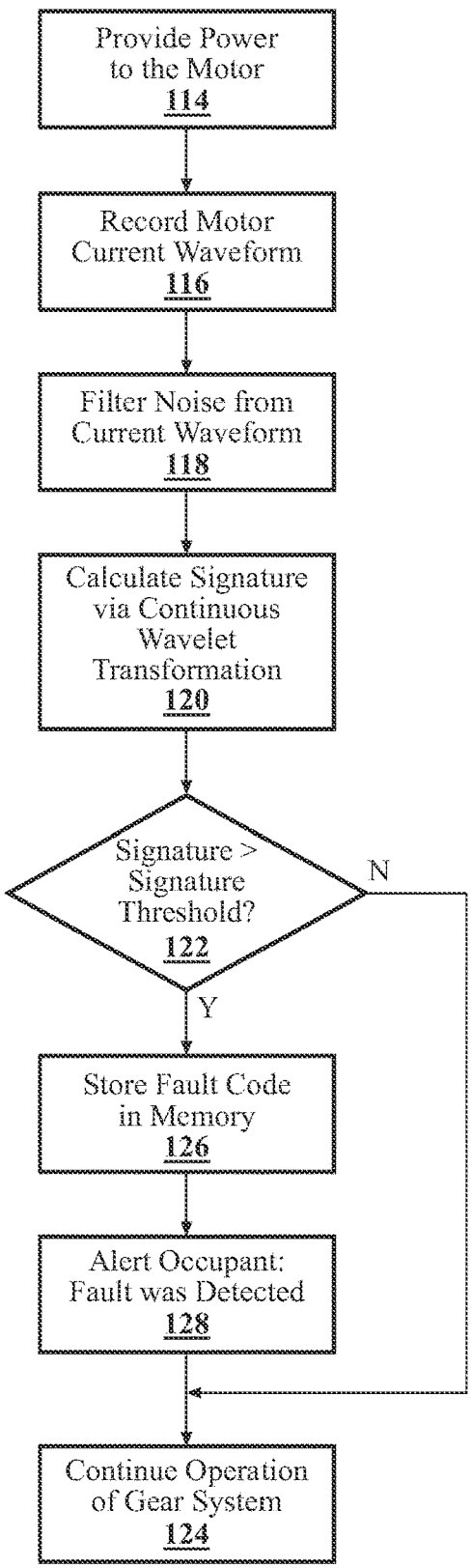
FIG. 16 is a flow chart of a second method for detecting an unhealthy gear train, according to another embodiment of the present invention.

A method for determining whether there are any faults in the gear system 24 according to a second embodiment of the present invention is shown in FIG. 16. In the second method, the ECU 22 initially provides power to the motor 29 (step 114) and records the motor current waveform 54, 54' (step 116). The ECU 22 then filters noise from the current waveform 54, 54' (step 118) and transforms the filtered current waveform 54, 54' using continuous wavelet transformation to produce a calculated signature (step 120). Continuous wavelet transformation uses a small specifically designed wave (which is also stretchable) to convolute with the current waveform 54, 54' being analyzed to extract hidden abnormal signatures embedded in transient and local data.

The ECU 22 compares the calculated signature with a predetermined signature threshold (step 122). The signature threshold is determined by comparing the signatures of the healthy and unhealthy gear systems 24. If the calculated signature is less than the signature threshold, then the gear system 24 is considered healthy and the ECU 22 continues operating the gear system 24 (step 124). If the calculated signature is greater than the signature threshold, then the gear system 24 is considered unhealthy and the ECU 22 stores a corresponding fault code in memory (step 126), and notifies the occupant that a fault has been detected (step 128). The ECU 22 then continues operation of the gear system 24 (step 124).

Figure 17:
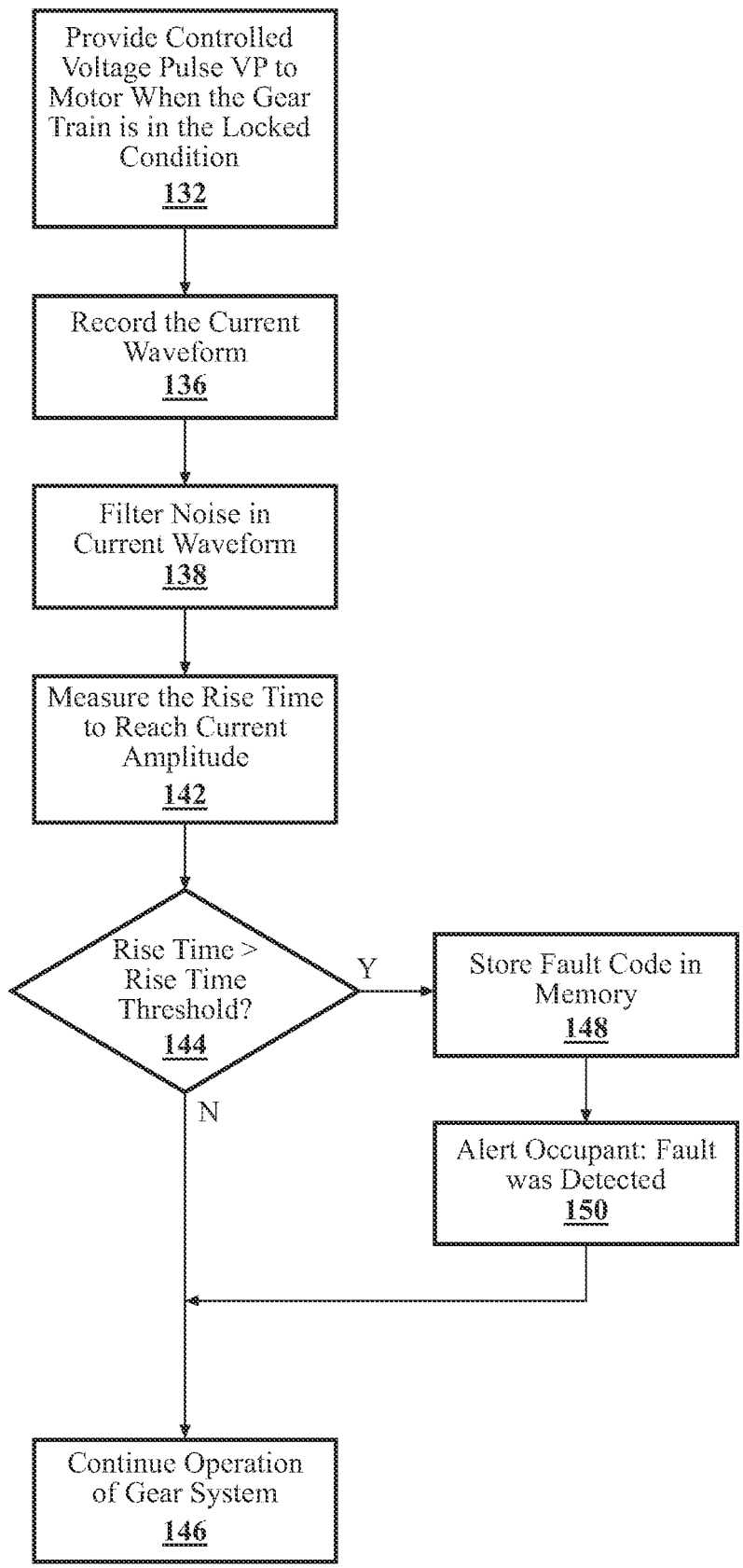
FIG. 17 is a flow chart of a third method for detecting an unhealthy gear train, according to another embodiment of the present invention.
Figure 18:
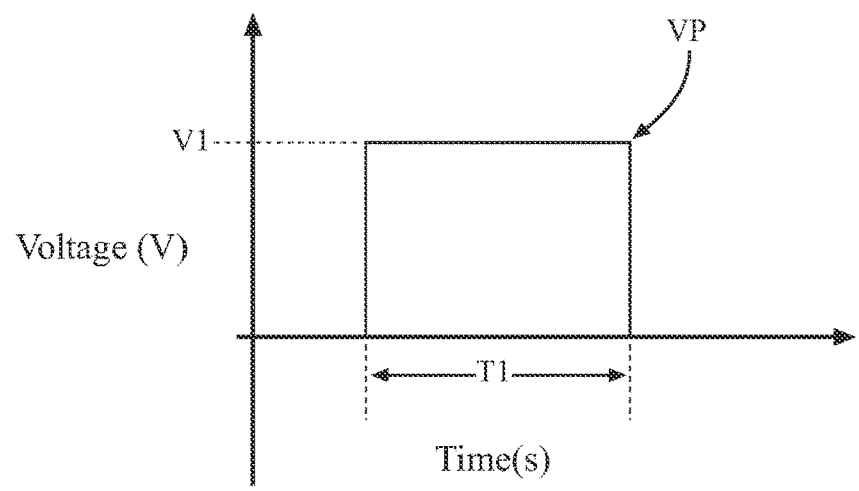
FIG. 18 is a graphical representation of a voltage pulse, according to another embodiment of the present invention.
Figure 19:
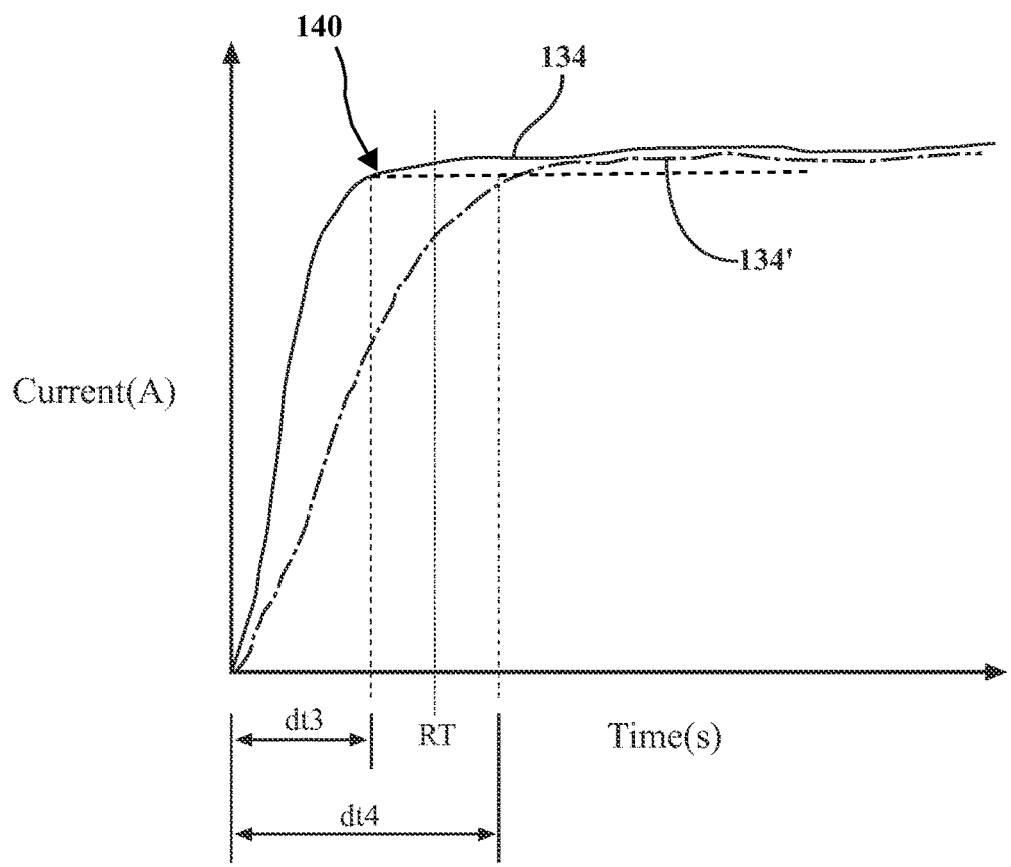
FIG. 19 is a graphical representation of current drawn by the motor of FIG. 2 in response to the voltage pulse of FIG. 18.

A method for determining whether there are any faults in the gear system 24 according to a third embodiment of the present invention is shown in FIGS. 17 through 19. Referring to FIG. 17, the ECU 22 initially provides a voltage pulse VP to the motor 29 (step 132) while the gear train 26 is in a locked condition. The voltage pulse VP has a voltage amplitude V1 and a time period T1 that is insufficient to cause unexpected movement of the seat assembly 10. In one embodiment, a controlled voltage pulse VP having a voltage amplitude V1 of about 7 volts is provided by the ECU 22 across the terminals of the motor 29 for a time period T1 of approximately 0.5 seconds, as shown in FIG. 18.

Referring back to FIG. 17, the ECU 22 records the resulting motor current waveform 134, 134' (step 136) and filters noise from the current waveform 134, 134' (step 138). FIG. 19 shows an exemplary current waveform 134 when the gear train 26 is properly locked, and an exemplary current waveform 134' when the gear train 26 is improperly locked. Referring to FIGS. 17 and 19, the ECU 22 measures the rise time dt3, dt4 between initialization of the controlled voltage pulse VP and the time that the current waveform 134, 134' reaches a predetermined amplitude 140 (step 142). The ECU 22 compares the measured rise time dt3, dt4 to a rise time threshold RT (step 144). The predetermined current amplitude 140 and the rise time threshold RT are selected based on experimental data comparing a healthy gear system 24 with an unhealthy gear system 24. Alternatively, the current amplitude 140 and the rise time threshold RT can be determined based in part on a prior evaluation of the gear system 24 by the ECU 22.

Referring to FIG. 17, if the measured rise time dt3, dt4 is less than or equal to the rise time threshold RT, then the gear system 24 is considered healthy and the ECU 22 continues operating the gear system 24 (step 146). If the measured rise time dt3, dt4 is greater than the rise time threshold RT, then the locking of the gear train 26 is not proper and the ECU 22 stores a corresponding fault code in memory (step 148), and notifies the occupant that a fault has been detected (step 150). The ECU 22 then continues operation of the gear system 24 (step 146).

Figure 20A:
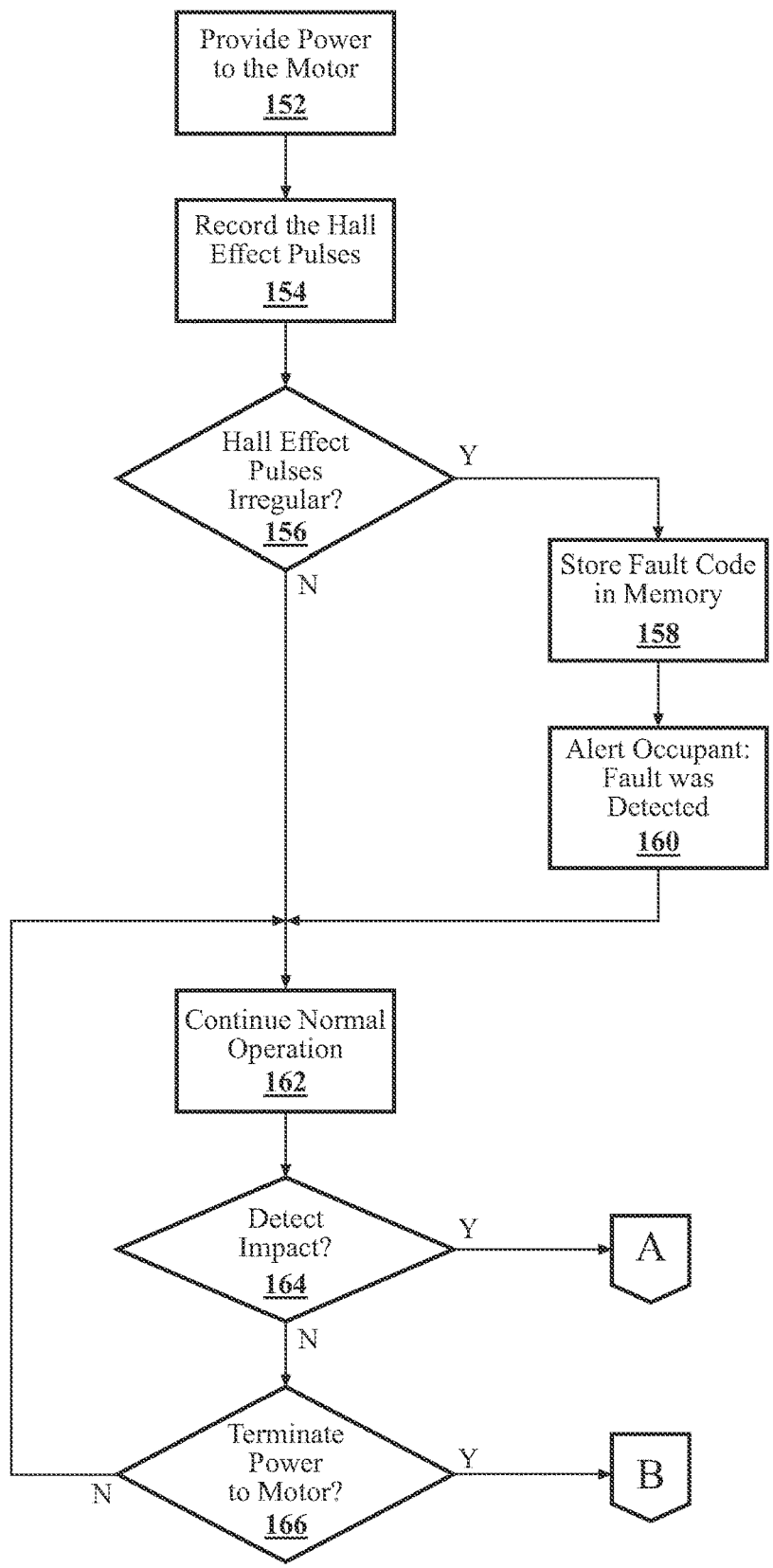
FIGS. 20A-B show a flow chart of a fourth method for detecting an unhealthy gear train, according to another embodiment of the present invention.
Figure 20B:
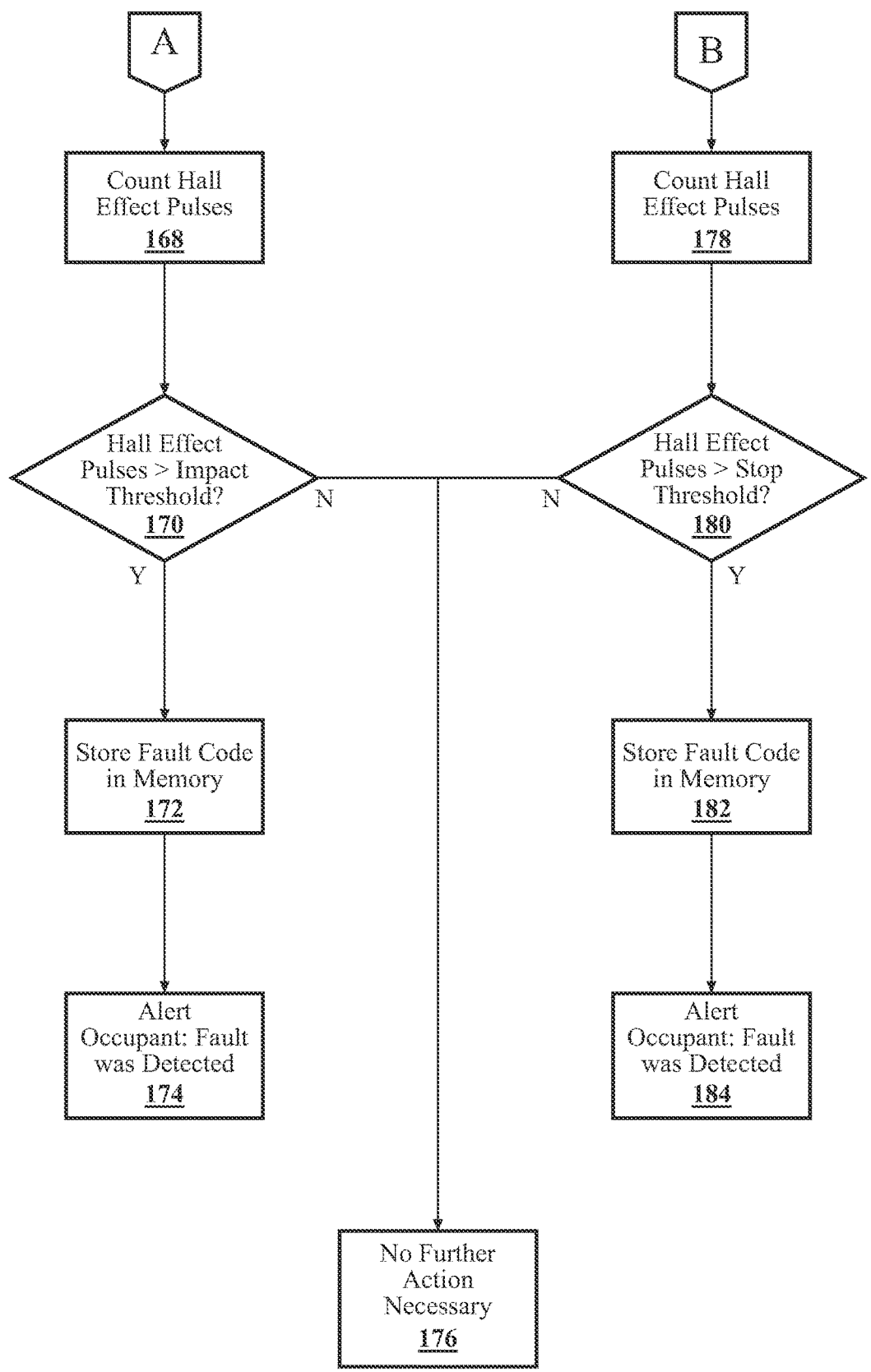

A method for determining whether there are any faults in the gear system 24 according to a fourth embodiment of the present invention is shown in FIGS. 20A-B. In the fourth method, the ECU 22 initially provides power to the motor 29 (step 152) and records the hall effect pulses 44 received from the hall effect sensor 38 in response to rotation of the drive shaft 36 (step 154). Next, the ECU 22 evaluates the hall effect pulses 44 (step 156). If the hall effect pulses 44 are irregular, then the gear system 24 is considered unhealthy, and the ECU 22 stores a corresponding fault code in memory (step 158) and notifies the occupant that a fault has been detected (step 160). After notifying the occupant about the fault, the ECU 22 continues to operate the gear system 24 (step 162). The ECU 22 also continues to operate the gear system 24 if at step 156 it did not detect irregular hall effect pulses 44.

While the ECU 22 operates the gear system 24 (step 162), it monitors for impacts (step 164) and waits until power to the motor 29 is terminated (step 166). If the ECU 22 detects an impact, then the ECU 22 counts the hall effect pulses 44 received after the impact was detected (step 168) and determines whether the counted hall effect pulses 44 exceeds a predetermined impact threshold (step 170). If the counted hall effect pulses 44 is greater than the impact threshold, then the gear system 24 is considered unhealthy and the ECU 22 stores a corresponding fault code in memory (step 172), and notifies the occupant that a fault has been detected (step 174). If the counted hall effect pulses 44 is less than or equal to the impact threshold, then no further action is required by the ECU 22 (step 176).

If the ECU 22 terminates power to the motor 29 (step 166), then the ECU 22 counts the hall effect pulses 44 received after power was terminated to the motor 29 (step 178), and determines whether the counted hall effect pulses 44 exceeds the predetermined stop threshold (step 180). If the counted hall effect pulses 44 is greater than the stop threshold, then the gear system 24 is considered unhealthy and the ECU 22 stores a corresponding fault code in memory (step 182), and notifies the occupant that a fault has been detected (step 184). If the counted hall effect pulses 44 is less than or equal to the stop threshold, then no further action is required by the ECU 22 (step 176).

Figure 21A:
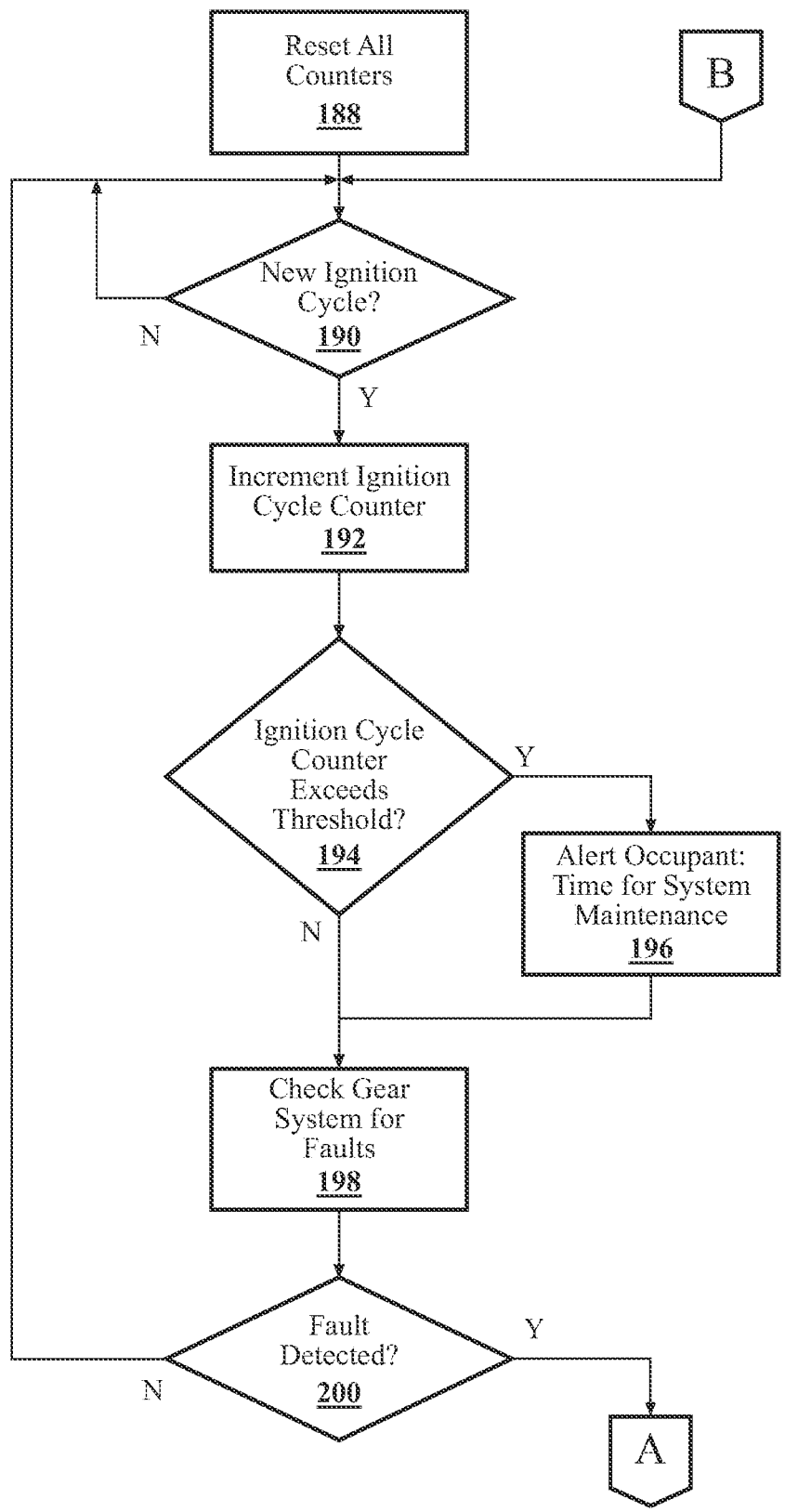
FIGS. 21A-B show a flow chart of a fifth method for detecting an unhealthy gear train, according to another embodiment of the present invention.
Figure 21B:
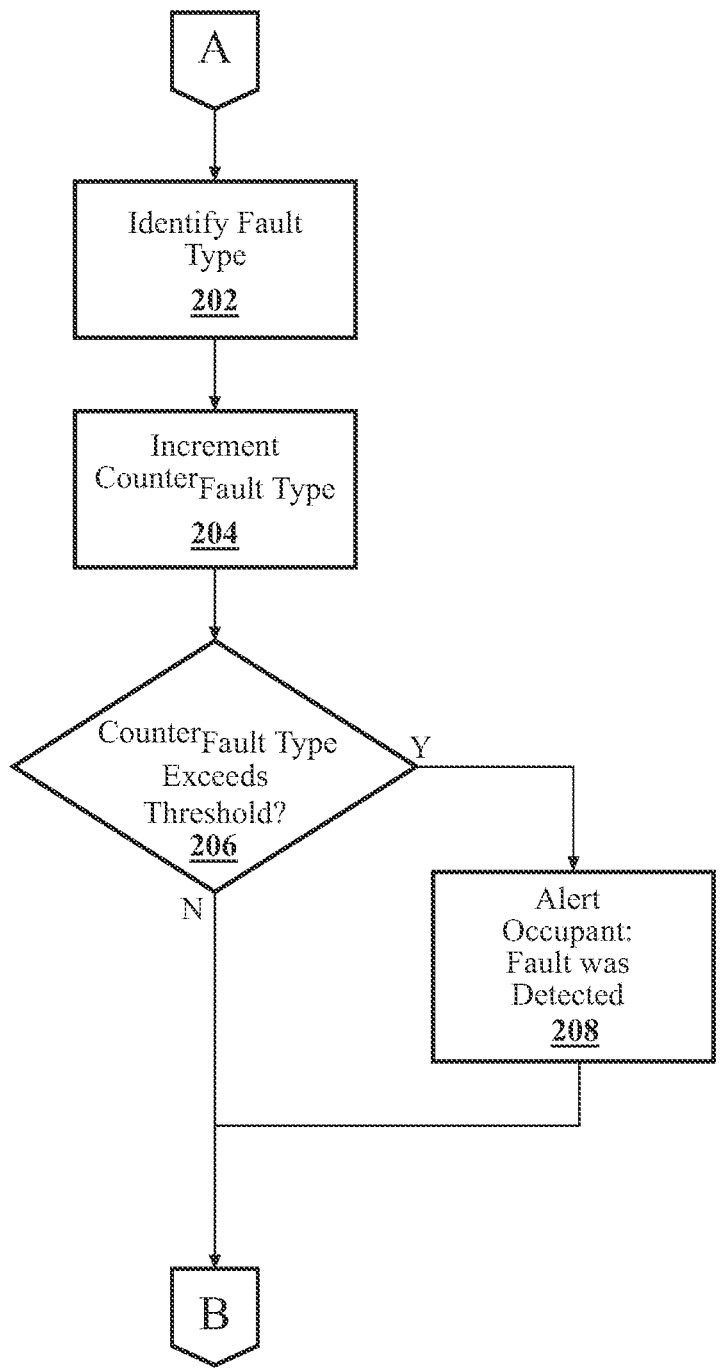

Each of the methods for evaluating the condition of the gear system 24 disclosed above may be repeated at any desired interval without varying the scope of the invention. For example, an exemplary method for notifying occupants of the seat assemblies 10 when to bring the automotive vehicle into service is shown in FIGS. 21A-B. Initially, all counters, including a counter for tracking the number of ignition cycles run between system maintenance and the counters used to track various defects in the seat assembly 10, are reset to zero (step 188). The ECU 22 waits for the start of a new ignition cycle (step 190) before it increments the ignition cycle counter (step 192). The ECU 22 then determines whether the ignition cycle counter exceeds a threshold (step 194). If the ignition cycle counter exceeds the threshold, then the ECU 22 alerts the occupant that it is time to bring the automotive vehicle in for system maintenance (step 196).

The ECU 22 then checks the gear system 24 for any faults (step 198). For example, the ECU 22 may run one or more of the methods disclosed above. The ECU 22 determines if any faults were detected (step 200). If any faults were detected, the ECU 22 identifies the fault type (step 202) and increments the counter for that fault type (step 204). The ECU 22 then checks if the counter for the fault type exceeds a threshold (step 206). If the counter for the fault type exceeds the threshold, then the ECU 22 notifies the occupant that the fault was detected (step 208) so that the occupant may bring the automotive vehicle in for service. The ECU 22 then waits for the next ignition cycle before running the process again.

The invention has been described in an illustrative manner, and it is to be understood that the terminology, which has been used, is intended to be in the nature of words of description rather than of limitation. Many modifications and variations of the present invention are possible in light of the above teachings. It is, therefore, to be understood that within the scope of the appended claims, the invention may be practiced other than as specifically described.

What is claimed is:

1. A method for detecting a fault in a gear system for repositioning a seat assembly in an automotive vehicle, wherein the gear system includes a gear train operatively coupled to a motor, the method comprising the steps of:
   measuring a current drawn by the motor to reposition the seat assembly;
   recording the current over time as a current waveform;
   converting the current waveform into a frequency domain;
   determining a base frequency of the current waveform based on the converted current waveform;
   calculating a power spectrum density at the base frequency;
   calculating a total band power of the power spectrum density; and
   determining whether the total band power is greater than a predetermined total band power threshold.

2. The method as set forth in claim 1, wherein if it is determined that the total band power is greater than the predetermined total band power threshold, recording an indication of a fault in memory.

3. The method as set forth in claim 1, wherein if it is determined that the total band power is greater than the predetermined total band power threshold, providing a notification that a fault has been detected.

4. The method as set forth in claim 1, further comprising the steps of:
   monitoring a number of times that the total band power is greater than the predetermined total band power threshold; and
   if the number exceeds a count threshold, providing a notification that a fault has been detected.

5. The method as set forth in claim 1, further comprising the step of filtering noise from the current waveform prior to transforming the current waveform into the frequency domain.

6. A method for detecting a fault in a gear system for repositioning a seat assembly in an automotive vehicle, wherein the gear system includes a gear train operatively coupled to a motor, the method comprising the steps of:
   measuring a current drawn by the motor to reposition the seat assembly;
   recording the current over time as a current waveform;
   using a continuous wavelet transformation process to calculate a signature of the current waveform; and
   determining whether the signature is greater than a predetermined signature threshold.

7. The method as set forth in claim 6, wherein if it is determined that the signature is greater than the predetermined signature threshold, recording an indication of a fault in memory.

8. The method as set forth in claim 6, wherein if it is determined that the signature is greater than the predetermined signature threshold, providing a notification that a fault has been detected.

9. The method as set forth in claim 6, further comprising the steps of:
   monitoring a number of times that the signature is greater than the predetermined signature threshold; and
   if the number exceeds a count threshold, providing a notification that a fault has been detected.

10. The method as set forth in claim 6, further comprising the step of filtering noise from the current waveform prior to calculating the signature of the current waveform.

11. A method for detecting a fault in a gear system for repositioning a seat assembly in an automotive vehicle, wherein the gear system includes a gear train operatively coupled to a motor, the method comprising the steps of:
    applying a voltage pulse to the motor;
    measuring a current drawn by the motor while the voltage pulse is applied to the motor;
    recording the current over time as a current waveform;
    determining a rise time in the current waveform for the current to reach a predetermined current amplitude; and
    determining whether the rise time is greater than a predetermined rise time threshold.

12. The method as set forth in claim 11, wherein if it is determined that the rise time is greater than the predetermined rise time threshold, recording an indication of a fault in memory.

13. The method as set forth in claim 11, wherein if it is determined that the rise time is greater than the predetermined rise time threshold, providing a notification that a fault has been detected.

14. The method as set forth in claim 11, further comprising the steps of:
    monitoring a number of times that the rise time is greater than the predetermined rise time threshold; and
    if the number exceeds a count threshold, providing a notification that a fault has been detected.

15. The method as set forth in claim 11, further comprising the step of filtering noise from the current waveform prior to calculating the rise time in the current waveform.

16. A method for detecting a fault in a gear system for repositioning a seat assembly in an automotive vehicle, wherein the gear system includes a gear train operatively coupled to a motor having a drive shaft, the method comprising the steps of:
    measuring a hall effect signal from the drive shaft indicating a rotational position and a rotational speed of the drive shaft over time;
    comparing the hall effect signal to an expected hall effect signal for the motor; and
    determining whether the hall effect signal is different from the expected hall effect signal.

17. The method as set forth in claim 16, wherein if it is determined that the hall effect signal is different from the expected hall effect signal, recording an indication of a fault in memory.

18. The method as set forth in claim 16, wherein if it is determined that the hall effect signal is different from the expected hall effect signal, providing a notification that a fault has been detected.

19. The method as set forth in claim 16, further comprising the steps of:
 monitoring a number of times that the hall effect signal is different from the expected hall effect signal; and
 if the number exceeds a count threshold, providing a notification that a fault has been detected.

20. The method as set forth in claim 16, wherein the comparing step comprises determining whether a pulse period in the hall effect signal fluctuates over time.

21. The method as set forth in claim 16, further comprising the step of terminating power to the motor, wherein the comparing step includes determining a number of pulses within the hall effect signal after terminating power to the motor.

22. The method as set forth in claim 16, further comprising the step of determining whether the gear train has encountered an impact, wherein the comparing step includes determining a number of pulses within the hall effect signal after the gear train encountered the impact.

\* \* \* \* \*